US012191808B1

(12) United States Patent
Hu et al.

(10) Patent No.: US 12,191,808 B1
(45) Date of Patent: Jan. 7, 2025

(54) TRANSFORMER-BASED DISTRIBUTED MULTICORE OSCILLATOR AND INTEGRATED CIRCUIT AND TERMINAL THEREOF

(71) Applicant: ANHUI TRANSILICA MICROELECTRONICS CO., LTD., Hefei (CN)

(72) Inventors: Yizhe Hu, Hefei (CN); Fujiang Lin, Singapore (SG)

(73) Assignee: ANHUI TRANSILICA MICROELECTRONICS CO., LTD., Hefei (CN)

( * ) Notice: Subject to any disclaimer, the term of this patent is extended or adjusted under 35 U.S.C. 154(b) by 0 days.

(21) Appl. No.: 18/828,071

(22) Filed: Sep. 9, 2024

Related U.S. Application Data (63) Continuation of application No. PCT/CN2022/139165, filed on Dec. 15, 2022.

(30) Foreign Application Priority Data

Mar. 11, 2022 (CN) .......................... 202210238763.4

(51) Int. Cl.
  *H03B 5/12* (2006.01)
(52) U.S. Cl.
  CPC .................................. *H03B 5/1212* (2013.01)
(58) Field of Classification Search
  CPC ................................................... H03B 5/1212
  (Continued)

(56) References Cited

U.S. PATENT DOCUMENTS

2007/0018739 A1\* 1/2007 Gabara ..................... G06F 1/10
  331/167
2016/0056762 A1\* 2/2016 Ximenes .................. H03B 1/00
  331/117 FE
(Continued)

FOREIGN PATENT DOCUMENTS

| CN | 111434030 A | 7/2020 |
| CN | 111434030 B | 7/2020 |

OTHER PUBLICATIONS

CNIPA, Notification of First Office Action for CN202210238763.4, Apr. 19, 2023.
(Continued)

*Primary Examiner* — Joseph Chang
(74) *Attorney, Agent, or Firm* — Hemisphere Law, PLLC; Zhigang Ma (57) ABSTRACT

The present invention belongs to the field of radio frequency integrated circuit technology, and specifically relates to a transformer-based distributed multicore oscillator and an integrated circuit and a terminal thereof. The oscillator includes four MOS transistors M1~M4, two transformers T1 and T2, two coarse capacitors arrays $C_{G1}$ and $C_{G2}$, two fine capacitors arrays $C_{D1}$ and $C_{D2}$, two tail inductances $L_{tail1}$ and $L_{tail2}$. A first cross-coupled transistors pair is constisted by two MOS transistors M1 and M2, and a second cross-coupled transistors pair is constisted by two MOS transistors M3 and M4. Two pair are adjacent and are set in centre of the layout. Two signal output ports are defined by two drain regions of any two MOS transistors from the two pairs. The present invention synchronously solves the problem of high thermal phase noise and low-frequency flicker phase noise in existing oscillators.

17 Claims, 3 Drawing Sheets

(58) Field of Classification Search
USPC .................................................. 331/117 FE
See application file for complete search history.

(56) References Cited

U.S. PATENT DOCUMENTS

| | | | | |
|---|---|---|---|---|
| 2016/0197582 A1* | 7/2016 | Aram | ................... | H03B 5/1228 |
| | | | | 331/108 A |
| 2017/0257064 A1* | 9/2017 | Cho | ................... | H01F 27/2871 |
| 2021/0391826 A1* | 12/2021 | Shin | ................... | H03B 5/1296 |

OTHER PUBLICATIONS

CNIPA, Notification to grant patent right for invention in CN202210238763.4, May 15, 2023.

\* cited by examiner

TRANSFORMER-BASED DISTRIBUTED MULTICORE OSCILLATOR AND INTEGRATED CIRCUIT AND TERMINAL THEREOF

FIELD OF THE INVENTION

The present invention relates to the field of radio frequency integrated circuit, in particular to a transformer-based distributed multicore oscillator, and more particularly to an integrated circuit and terminal thereof.

BACKGROUND OF THE INVENTION

It is a major component of a 5G/6G communication chip for a millimetre-wave generator. The millimetre-wave generator for low-phase noise has been an important subject. It is an effective means for reducing thermal PN to design the millimetre-wave generator as a distributed multicore oscillator. But the flicker PN of this kind of oscillators is still very high. When the distributed multicore oscillator is used in the millimetre-wave generator, the flicker PN is difficult to filter. The shaking phenomenon will be worse for the local oscillator signals used in a communication chip, and then the signal transmission rate of the communication chip is limited.

Figure 1:
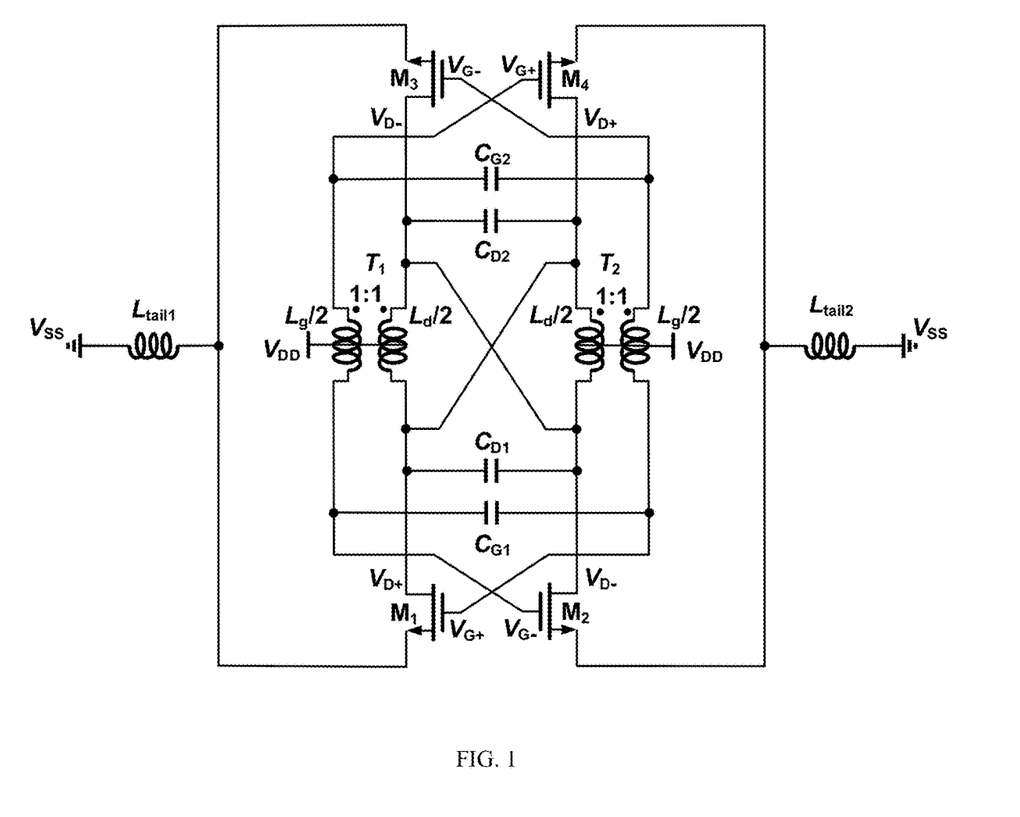
FIG. 1 is a circuit diagram of a transformer-based distributed multicore oscillator, according to the first embodiment of the present invention.

Referring to FIG. 1, a traditional inductance-based distributed multicore oscillator is shown as follows. A resonant cavity is formed by a capacitance C and a distributed inductance. Two cross-coupled pairs (M1/M2 and M3/M4) are distribution equidistantly on a single turn inductance, for providing "negative resistance" to the oscillator. Specially, further cross-coupled can ensure that a harmonic current is formed a loop along the single turn inductance because of only one resonance. As to a conventional inductance oscillator, the distributed multicore oscillator is halved for resonator inductance value and doubled for capacitance, with the same frequency and the same quality factor of resonance cavity. Then it is inhibited effectively for Waveform Phase Scrambling caused by current noise which is injected into the resonant cavity, and it is also doubled for inhibitory effect of the thermal PN. Specially, compare with the conventional inductance oscillator, while evidently improving the performance of the distributed multicore oscillator, it is not increased significantly for structural size of the circuit of the distributed multicore oscillator.

However, in the current distributed multicore oscillator, the location between the VDD (Voltage Drain Drain) and the VSS (Visual Source Safe) is too far away, so a quadratic harmonic current (IH2) must have undergone the decoupling capacitor located between the VDD and the VSS. Then a great of stray inductance generated by the decoupling capacitor is result in that the rising and falling sides of the oscillation waveform are not symmetrical and the flicker PN is very high.

SUMMARY OF THE INVENTION

The object of the present invention is to provide a transformer-based distributed multicore oscillator to solve the problem that the current distributed multicore oscillator can only change the thermal PN but still be with the high flicker PN. Another object of the present invention provides an integrated circuit encapsulated by the transformer-based distributed multicore oscillator. The third object of the present invention provides a terminal used the transformer-based distributed multicore oscillator.

It is adopted by the present invention to realize with the following technical scheme.

A transformer-based distributed multicore oscillator, used as a millimeter wave oscillator, includes: four MOS transistors M1~M4, two transformers T1 and T2, two coarse capacitors arrays $C_{G1}$ and $C_{G2}$, two fine capacitors arrays $C_{D1}$ and $C_{D2}$, two tail inductances $L_{tail1}$ and $L_{tail2}$.

wherein a first cross-coupled transistors pair is constisted by two MOS transistors M1 and M2, a second cross-coupled transistors pair is constisted by two MOS transistors M3 and M4; the two transformers T1 and T2 are set symmetrically with two inner coils $L_d$ being defined inside and two outer coils $L_g$ being defined outside; the inner coil $L_d$ of the transformer T1, the fine capacitors array $C_{D1}$, the inner coil $L_d$ of the transformer T2, the fine capacitors array $C_{D2}$ are connected in series successively; the outer coil $L_g$ of the transformer T1, the coarse capacitors array $C_{G1}$, the outer coil $L_g$ of the transformer T2, the coarse capacitors array $C_{G2}$ are connected in series successively; the two inner coils $L_d$ are cross-linked; two drain regions of two MOS transistors M1 and M2 are connected with two ends of the fine capacitors array $C_{D1}$ respectively, two drain regions of two MOS transistors M3 and M4 are connected with two ends of the fine capacitors array $C_{D2}$ respectively; two grid regions of two MOS transistors M1 and M2 are connected with two ends of the coarse capacitors array $C_{G1}$ respectively, two grid regions of two MOS transistors M3 and M4 are connected with two ends of the coarse capacitors array $C_{G2}$ respectively; two source regions of two MOS transistors M1 and M3 are both connected to a ground Vss via the tail inductances $L_{tail1}$, two source regions of two MOS transistors M2 and M4 are both connected to the ground Vss via the tail inductances $L_{tail2}$; taps of the two transformers T1 and T2 are connected with a voltage source Vdd.

two signal output ports are defined by two drain regions of any two MOS transistors from the two cross-coupled transistors pairs.

In the oscillator of the present invention, the two transformers T1 and T2 have the same construction and the same turns ratio of 1:1 between the inner coil $L_d$ and the outer coil $L_g$;

In the oscillator of the present invention, each capacitors array of $C_{G1}$, $C_{G2}$, $C_{D1}$ and $C_{D2}$ comprises a plurality of switched capacitors which are in parallel, and each switched capacitor is a adjustable capacitor.

In the oscillator of the present invention, the two coarse capacitors arrays $C_{G1}$ and $C_{G2}$ have the same specifications and parameters; the two fine capacitors arrays $C_{D1}$ and $C_{D2}$ have the same specifications and parameters; the capacitances of the adjustable capacitors are changed synchronously for getting right frequency of the output of the oscillator.

In the oscillator of the present invention, capacitors in the coarse capacitors array are gate capacitances, and capacitors in the fine capacitors array are source capacitances; the ratio of capacitance value between the gate capacitance and the source capacitance is 2~4.

In the oscillator of the present invention, a capacitor defined as a decoupling capacitor is electrically connected between the ground Vss and the voltage source Vdd.

The present invention provides an integrated circuit, including a transformer-based distributed multicore oscillator described above. In the layout of the integrated circuit, the oscillator is further designed as follows.

(1) in the cross-coupled unit, the four MOS transistors M1~M4 being located at the four corners of a rectangular area one by one; any two adjacent MOS transistors being symmetric.

(2) the two transformers T1 and T2 being symmetrical; the two inner coils $L_d$ being cross-linked.

(3) the fine capacitors array $C_{D1}$ and the coarse capacitors array $C_{G1}$ being close to the first cross-coupled transistors pair, the fine capacitors array $C_{D2}$ and the coarse capacitors array $C_{G2}$ being close to the second cross-coupled transistors pair.

(4) two voltage sources Vdd and two grounds Vss being arranged outside of the cross-coupled unit, a first group being defined by one voltage source Vdd and one ground Vss and being close to the two MOS transistors M1 and M3, a second group being defined by another voltage source Vdd and another ground Vss and being close to the two MOS transistors M2 and M4; the two groups having a shortest physical distance.

In the integrated circuit of the present invention, a NT_N layer being arranged in a annular region distributed by the two transformers T1 and T2; the cross-coupled unit being located inside of the annular region and being out of touch with the NT_N layer; all capacitors arrays being located outside of the annular region.

In the integrated circuit of the present invention, a full-differential capacitors array is defined by the two coarse capacitors arrays and the two fine capacitors arrays; the tail inductance $L_{tail1}$ is electrically connected between the ground Vss and the two source regions of the two MOS transistors M1 and M3, the tail inductance $L_{tail2}$ is electrically connected between the ground Vss and the two source regions of the two MOS transistors M2 and M4; the two tail inductances $L_{tail1}$ and $L_{tail2}$ run form the annular region without of touch with the NT_N layer to be below of the voltage source Vdd; a decoupling capacitor is connected between the voltage source Vdd and the ground Vss.

The present invention provides a terminal, includes an RF frequency device and an integrated circuit described above, used to provide a local carrier signal for the RF device.

The technical scheme provided by the present invention has the following beneficial effects.

1. The present invention adopts a circuit and component connection mode of the oscillator, and further adopts proper size tail inductance and fully differential capacitance array. It is solved for the problem of variable return path of traditional circuit. It not only ensures low thermal phase noise, but also avoids the problem of flicker noise up-regulation in conventional circuits due to the uncertainty of parasitic inductance.

2. The present invention provides an improvement method of the circuit in the manufacturing process. In the layout design of the product integrated circuit, the four MOS are arranged in the center of the layout using a special "cross-coupling" connection mode, and the transformer and capacitors array are arranged outside the MOS transistor. Special Native layer layout design is adopted to reduce the influence of circuit connection relationship on transformer Q value.

3. It is effectively for the present invention to suppress the low frequency flicker phase noise in the "negative phase shift saturation interval" of the circuit through the proposed 1:1 distributed transformer structure. In addition, the transformer gain further suppresses the thermal phase noise. The performance of the circuit thermal phase noise and low-frequency flicker phase noise is improved synchronously.

4. The output signal of the oscillator has a wide frequency range and can output a higher frequency signal. The output signal can be precisely adjusted by coarse capacitors array and fine capacitors array. A single full-function circuit unit can output two outputs that have exactly the same characteristics and do not produce any interference with each other, which can be applied to more diverse scenarios.

DETAILED DESCRIPTION OF PREFERRED EMBODIMENTS

The present invention will now be described more specifically with reference to the following embodiments. It is to be noted that the following descriptions of preferred embodiments of this invention are presented herein for the purpose of illustration and description only. It is not intended to be exhaustive or to be limited to the precise disclosed form.

First Embodiment

The first embodiment provides a transformer-based distributed multicore oscillator used for generating the desired AC signal under DC power supply conditions. Referring to FIG. 1, the transformer-based distributed multicore oscillator includes four MOS transistors M1~M4, two transformers T1 and T2, two coarse capacitors arrays $C_{G1}$ and $C_{G2}$, another two capacitors arrays $C_{D1}$ and $C_{D2}$, and two inductances $L_{tail1}$ and $L_{tail2}$. The two transformers $T_1$ and $T_2$ are symmetrical in location. The two capacitors arrays $C_{G1}$ and $C_{G2}$ have the same structure, are symmetrical in location, and are used for adjusting voltage roughly. The two capacitors arrays $C_{D1}$ and $C_{D2}$ have the same structure, are symmetrical in location, and are used for adjusting voltage roughly.

A first cross-coupled transistors pair is constituted by two MOS transistors $M_1$ and $M_2$, a second cross-coupled transistors pair is constituted by two MOS transistors $M_3$ and $M_4$. There are inner coil $L_d$ and outer coil $L_g$ both in transformers $T_1$ and $T_2$. A first loop is constituted by the capacitors arraie $C_{D1}$, the inner coil $L_d$ of the transformer $T_1$, the capacitors arraie $C_{D2}$ and the inner coil $L_d$ of the transformer $T_2$, which are connected electrically in sequence. A second loop is constituted by the capacitors arraie $C_{G1}$, the outer coil $L_g$ of the transformer $T_1$, the capacitors arraie $C_{G2}$ and the outer coil $L_g$ of the transformer $T_2$, which are connected electrically in sequence. The two the inner coils $L_d$ are cross-linked. The two drain regions of two MOS transistors M1 and M2 are connected with two ends of the fine capacitors array $C_{D1}$ respectively, and the two drain regions of two MOS transistors M3 and M4 are connected with two ends of the fine capacitors array $C_{D2}$ respectively. The two grid regions of two MOS transistors M1 and M2 are connected with two ends of the coarse capacitors array $C_{G1}$ respectively, and the two grid regions of two MOS transistors M3 and M4 are connected with two ends of the coarse capacitors array $C_{G2}$ respectively. The two source regions of two MOS transistors M1 and M3 are both connected to a ground Vss via the tail inductances $L_{tail1}$, and the two source regions of two MOS transistors M2 and M4 are both connected to the ground Vss via the tail inductances $L_{tail2}$. Taps of the two transformers T1 and T2 are connected with a voltage source Vdd.

In the present invention, a distributed multi-core resonator is consisted by capacitors arrays and a transformer with distributed structure, and is used to generate AC output signal of oscillation circuit. Two cross-coupled transistors pairs (M1/M2 and M3/M4) that provide the energy required for oscillation of the oscillator. The tail inductance provides a high common-mode impedance to suppress the second harmonic component of the output signal. All three work together to convert the DC energy provided by the power supply into a clean AC energy output.

In the first cross-coupled transistors pair or in the second cross-coupled transistors pair, the drain regions of the two MOS transistors are drawn out as signal output ports respectively. In the present embodiment, at most two identical signals can be output of the oscillator.

Combined with the circuit diagram in FIG. 1, it can be found that the scheme of the invention sets both the voltage source Vdd and the ground Vss on the left and right sides of the circuit of the oscillator. So that the physical distance between the power and the ground on the chip is shortest, and the parasitic inductance in the decoupling capacitor is greatly reduced. The rising edge and falling edge of the generated oscillation waveform are more symmetrical, and the problem of the variable return path of the circuit common mode is solved, and the influence of low-frequency flicker phase noise is eliminated.

In the circuit structure of the present invention, all capacitors arrays (both the two coarse capacitors arrays $C_{G1}$ and $C_{G2}$, and two fine capacitors arrays $C_{D1}$ and $C_{D2}$) are composed of a plurality of turn-off capacitor units in parallel with each other. All capacitance values of all capacitors arrays are adjustable. In order to maintain the symmetry of the whole circuit structure and ensure the functional stability of the whole circuit, the specifications of all capacitors arrays are exactly the same. The frequency of the output AC signal is adjusted by synchronously adjusting the capacitors values of the coarse capacitors arrays $C_{G1}$ and $C_{G2}$, and the fine capacitors arrays $C_{D1}$ and $C_{D2}$. That is to say: the two coarse capacitors arrays $C_{G1}$ and $C_{G2}$ have the same specifications and parameters; the two fine capacitors arrays $C_{D1}$ and $C_{D2}$ have the same specifications and parameters; the capacitances of the adjustable capacitors are changed synchronously for getting right frequency of the output of the oscillator.

The two coarse capacitors arrays $C_{G1}$ and $C_{G2}$ are used as the grid cavity capacitor, and the two fine capacitors arrays $C_{D1}$ and $C_{D2}$ are used as the source level cavity capacitor. Considering that the adjustment sensitivity of the two should be different, so as to achieve the effect of coarse and fine adjustment, the ratio of capacitance value of the grid cavity capacitor and the source level cavity capacitor is set to 2~4 in this embodiment. That is to say: capacitors in the coarse capacitors array are gate capacitances, and capacitors in the fine capacitors array are source capacitances; the ratio of capacitance value between the gate capacitance and the source capacitance is 2~4.

In the circuit structure of the present invention, both the coarse capacitors arrays and the fine capacitors arrays are in the form of a fully differential capacitor array, and a capacitor is also connected between the Vss at the ground end and the Vdd at the power end as a decoupling capacitor. At the same time, the tail inductance of appropriate size is added between the ground Vss and the MOS transistors. Therefore, the multi-core oscillator can control the common mode return path into the inductive impedance, and effectively utilize the "negative phase-shift saturation region" of the transformer, so that the circuit can effectively suppress low frequency noise over a wide tuning range.

The main effect of scintillation current noise in cross-coupled transistors pairs is to inject the resonator at the rising and falling edges of the VDS (the voltage difference between the drain and the source), which causes the phase shift of the waveform. The direction of the resulting phase shift is opposite in the ascending and descending directions. The magnitude of phase shift depends on the intensity of flicker noise during rising and falling edges, as well as the slope of voltage rising or falling edges. The steeper the edge, the better the resistance to current noise. If the rising and falling sides of the oscillator waveform are symmetrical, it is possible that the phase shifts caused by the flicker current noise in one cycle cancel each other out and do not convert to phase noise.

In the scheme of this embodiment, the common-mode return path into the inductive impedance can be controlled by adding a tail inductor of appropriate size and adopting a fully differential capacitor array. This makes the rising edge of VDS steeper than the falling edge, that is, the phase shift introduced by the same amount of scintillation noise on the rising edge is less than the opposite phase shift caused by the falling edge (the net phase shift is not 0). Therefore, flicker noise is converted to phase noise in one cycle. However, the intensity of the scintillation noise of cross-coupled pairs varies in amplitude over a period, mainly depending on the $V_{GS}$ (voltage difference between the gate and the source). This embodiment introduces a negative phase shift of $V_{GS}$ to $V_{DS}$ through the transformer structure (allowing the top of $V_{GS}$ to be near the steep rising edge of $V_{DS}$) to increase the intensity of noise current injection during the rising edge, and increase the phase shift introduction of the rising edge, so that the net phase shift of the circuit in one signal cycle is 0, and the flicker current noise cannot be converted into phase noise.

In the transformer type distributed multi-core oscillator provided in the present embodiment. The transformers T1 and T2 have the same structure. In the transformers T1 and T2, the turn ratio of the inner coil and the outer coil is 1:1, so the each transformer is more suitable for millimeter wave oscillator and its equivalent voltage gain is greater than 1, which further improves the circuit's suppression effect on thermal phase noise.

Considering that the transformer-based distributed multi-core oscillator is mainly used in integrated circuits, and the equivalent gain ratio of a planar transformer with a turn-on-chip ratio of 1:1 is $\sqrt{Lg/Ld}$ (greater than 1), it still has the desired transformer gain. Moreover, in this embodiment, since the ratio of the gate cavity capacitance to the source level cavity capacitance has been set to an appropriate range (e.g. 2 to 4), the oscillator can be made to operate in the "transformer passive gain saturation region". The conversion of thermal noise to thermal phase noise is suppressed and a wide tuning range is achieved. The transformer with a turn ratio of 1:1 used in this embodiment has a turn ratio of 2 compared to the previous one: 1 transformer, in the case of the transformer inner diameter unchanged, the overall inductance value of the transformer is significantly reduced, and the output frequency of the oscillator is further improved, making the output signal reach a higher frequency range, more suitable for use as a millimeter wave oscillator application, improve the practical value of the product.

Taking the above analysis into account, it can be found that the transformer-based distributed multicore oscillator provided in this embodiment can further improve the low frequency flicker phase noise effect while improving the thermal phase noise suppression effect. Therefore, it is very suitable for application in new communication chips such as 5G/6G, and improve the signal transmission rate of communication chips.

Second Embodiment

Based on the transformer-based distributed multicore oscillator designed in the first embodiment 1, this embodiment further provides an integrated circuit of the oscillator. By adopting the form of integrated circuit, it can be more convenient to manufacture and apply the transformer.

The integrated circuit provided in this embodiment comprises a circuit structure such as that of the oscillator in the first embodiment. In order to further improve the performance of the oscillator through the process and technology, the following layout is also used in the layout of the integrated circuit.

Figure 2:
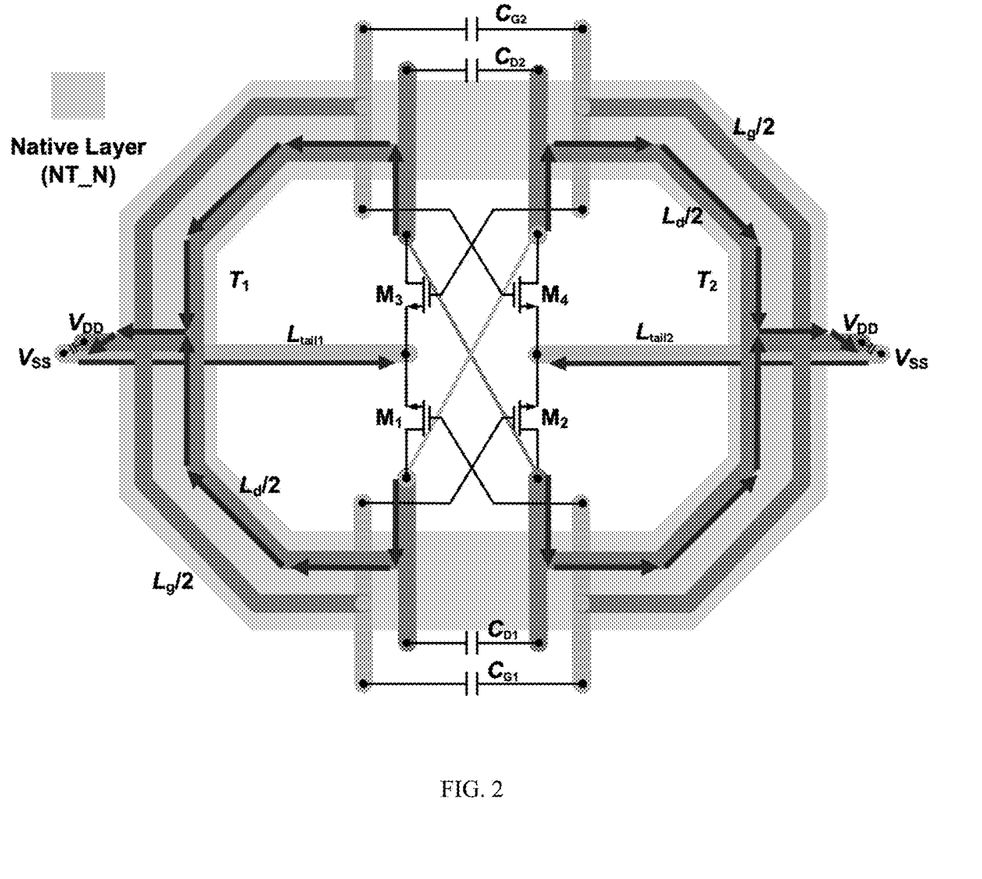
FIG. 2 is an integrated circuit layout diagram of a transformer-based distributed multicore oscillator, according to the second embodiment of the present invention.

(1) A cross-coupled unit is defined by the two cross-coupled transistors pairs, and the two cross-coupled transistors pairs are adjacent and being set in centre of the layout. In the cross-coupled unit, the four MOS transistors M1~M4 are located at the four corners of a rectangular area one by one. Any two adjacent MOS transistors are symmetric.

(2) The two transformers T1 and T2 are set on the periphery of the cross-coupled unit, maintaining the symmetry structure of the two transformers. The two transformers T1 and T2 are symmetrical. The two inner coils $L_d$ are cross-linked.

(3) All capacitors arrays are set on the periphery of the cross-coupled unit. The coarse capacitors arrays are outerside and the fine capacitors arrays are inside. The fine capacitors array $C_{D1}$ and the coarse capacitors array $C_{G1}$ are close to the first cross-coupled transistors pair, the fine capacitors array $C_{D2}$ and the coarse capacitors array $C_{G2}$ are close to the second cross-coupled transistors pair.

(4) Two voltage sources Vdd and two grounds Vss are arranged outside of the cross-coupled unit. A first group defined by one voltage source Vdd and one ground Vss is close to the two MOS transistors M1 and M3. A second group defined by another voltage source Vdd and another ground Vss is close to the two MOS transistors M2 and M4. The two groups have a shortest physical distance.

The specific layout of the oscillator in this integrated circuit is shown in FIG. 2. In FIG. 2, a NT_N layer is arranged in a annular region distributed by the two transformers T1 and T2. The cross-coupled unit is located inside of the annular region and is out of touch with the NT_N layer. All capacitors arrays are located outside of the annular region.

The NT-N layer is an undoped N-type active region commonly used for isolation in RF layouts. This embodiment achieves the goal of reducing substrate impurities and effectively improving the substrate resistivity and coil quality factor by using a hollow NT-N layer to completely cover the substrate below the coil. At the same time, this process also places the cross coupled pairs composed of MOS transistors in the hollow area in the center of the NT-N layer, without covering the MOS transistor with the NT-N layer, thus avoiding latch up effects in the transistor.

In the layout design of this embodiment, a full-differential capacitors array is defined by the two coarse capacitors arrays and the two fine capacitors arrays. The tail inductance $L_{tail1}$ is electrically connected between the ground Vss and the two source regions of the two MOS transistors M1 and M3. The tail inductance $L_{tail2}$ is electrically connected between the ground Vss and the two source regions of the two MOS transistors M2 and M4. The two tail inductances $L_{tail1}$ and $L_{tail2}$ run form the annular region without of touch with the NT_N layer to be below of the voltage source Vdd. A decoupling capacitor is connected between the voltage source Vdd and the ground Vss.

Specifically, in this embodiment, the cross-coupled transistors pairs (M1, M2 and M3, M4) that serve as "negative resistors" are placed inside the transformer. A "linear" tail inductance is added through layout wiring to further narrow the distance between the power supply terminal $V_{DD}$ and the ground terminal Vss of the oscillator circuit, thereby reducing the parasitic inductance of the decoupling capacitance between $V_{DD}$ and $V_{SS}$. It is avoid to cause the problem of increased flicker noise because of the uncertainty of parasitic inductances in traditional inductor type distributed circuits.

Figure 3:
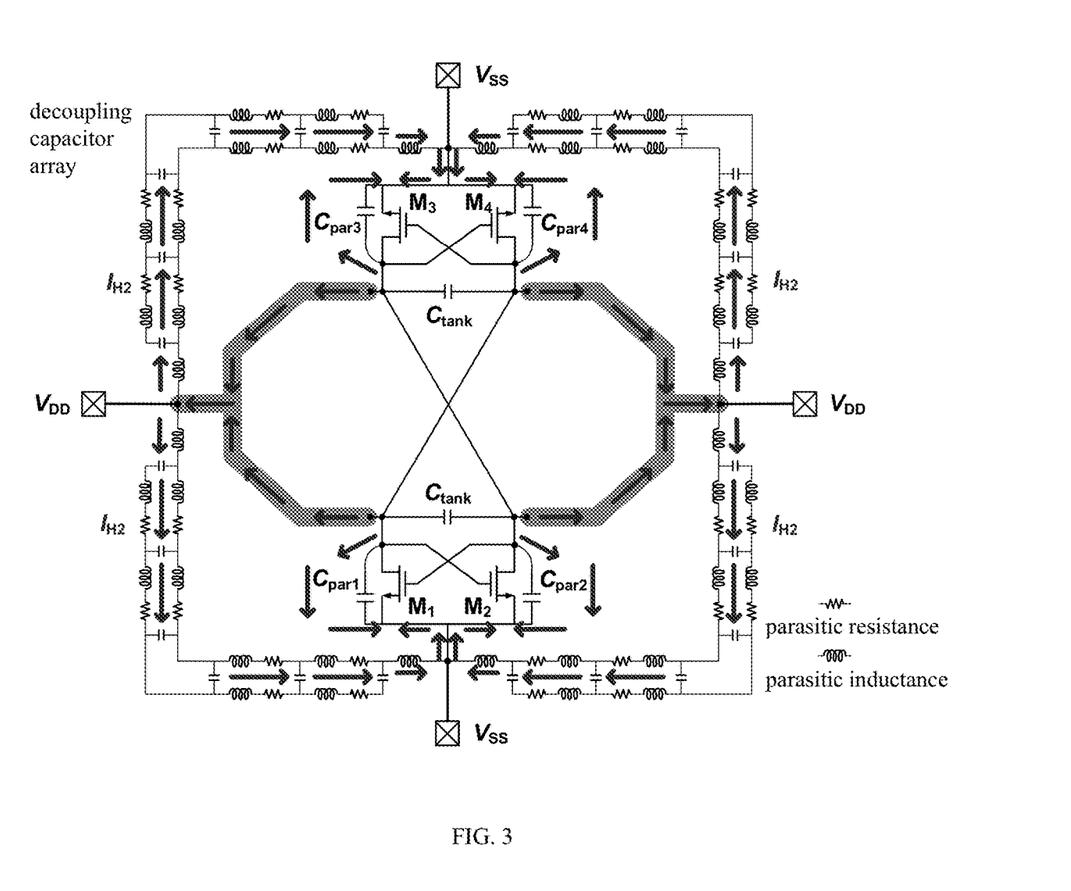
FIG. 3 is an integrated circuit layout diagram of a traditional inductance-based distributed multicore oscillator in order to compare with the second embodiment of the present invention.

Refer to FIG. 3, a layout of a typical oscillator (i.e. the multi-core oscillator mentioned in the background technology) is shown, and the common mode return path in the decoupling capacitor of the circuit (indicated by the arrow) is further shown. FIG. 2 shows the layout of the transformer type distributed multi-core oscillator in this embodiment, where the common mode return path (indicated by the arrow) in the circuit is also marked. By comparing FIGS. 2 and 3, it can be observed that. In FIG. 3, a complex decoupling capacitor array containing a large number of parasitic inductors and resistors is used, but the common mode return path in the circuit is still non directional. In the circuit of this embodiment, only a simple capacitor needs to be connected between $V_{DD}$ and $V_{SS}$ as a decoupling capacitor to achieve fully determined common mode return.

It can be seen that the technical solution provided in this embodiment can significantly improve the product performance of the oscillators through innovative circuit design and more optimized circuit layout.

Third Embodiment

This embodiment further provides a terminal based on the aforementioned embodiments, which includes at least a radio frequency device and an integrated circuit of a oscillator as described in embodiment 2. The integrated circuit of the oscillator is used to provide local carrier signals for the radio frequency device.

In the above terminals, the type of RF device is not limited to any form, for example, it can be the cellular mobile communication module, Bluetooth module, WiFi module, or other devices that require local carrier signals in the terminal.

The terminal referred to in this embodiment is only one application scenario of the integrated circuit of the oscillator in embodiment 2. In fact, the practical application of the oscillator is very extensive. Even including phase-locked loop products, communication base stations, terminal devices such as mobile phones and computers that require communication functions, and so on.

The core function of the oscillator mentioned in this embodiment is to generate a frequency source of AC signals that meet the design objectives under power supply conditions. Therefore, any device or system that directly or indirectly uses the integrated circuit of the oscillator designed in this embodiment to generate the required frequency signal with low thermal phase noise and low-frequency flicker phase noise characteristics is considered a terminal as described in this embodiment.

While the invention has been described in terms of what is presently considered to be the most practical and preferred embodiments, it is to be understood that the invention needs not to be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A transformer-based distributed multicore oscillator, used as a millimeter wave oscillator, comprises: four MOS transistors M1~M4, two transformers T1 and T2, two coarse capacitors arrays $C_{G1}$ and $C_{G2}$, two fine capacitors arrays $C_{D1}$ and $C_{D2}$, two tail inductances $L_{tail1}$ and $L_{tail2}$;

wherein a first cross-coupled transistors pair is constisted by two MOS transistors M1 and M2, a second cross-coupled transistors pair is constisted by two MOS transistors M3 and M4; the two transformers T1 and T2 are set symmetrically with two inner coils $L_d$ being defined inside and two outer coils $L_g$ being defined outside; the two transformers T1 and T2 have the same construction and the same turns ratio of 1:1 between the inner coil $L_d$ and the outer coil $L_g$; the inner coil $L_d$ of the transformer T1, the fine capacitors array $C_{D1}$, the inner coil $L_d$ of the transformer T2, the fine capacitors array $C_{D2}$ are connected in series successively; the outer coil $L_g$ of the transformer T1, the coarse capacitors array $C_{G1}$, the outer coil $L_g$ of the transformer T2, the coarse capacitors array $C_{G2}$ are connected in series successively; the two inner coils $L_d$ are cross-linked; two drain regions of two MOS transistors M1 and M2 are connected with two ends of the fine capacitors array $C_{D1}$ respectively, two drain regions of two MOS transistors M3 and M4 are connected with two ends of the fine capacitors array $C_{D2}$ respectively; two grid regions of two MOS transistors M1 and M2 are connected with two ends of the coarse capacitors array $C_{G1}$ respectively, two grid regions of two MOS transistors M3 and M4 are connected with two ends of the coarse capacitors array $C_{G2}$ respectively; two source regions of two MOS transistors M1 and M3 are both connected to a ground Vss via the tail inductances $L_{tail1}$, two source regions of two MOS transistors M2 and M4 are both connected to the ground Vss via the tail inductances $L_{tail2}$; taps of the two transformers T1 and T2 are connected with a voltage source Vdd;

two signal output ports are defined by two drain regions of any two MOS transistors from the two cross-coupled transistors pairs;

the layout of the oscillator is designed as follows:

a cross-coupled unit being defined by the two cross-coupled transistors pairs, and the two cross-coupled transistors pairs being adjacent and being set in centre of the layout;

the two transformers T1 and T2 being set on the periphery of the cross-coupled unit;

all capacitors arrays being set on the periphery of the cross-coupled unit, and the coarse capacitors arrays being outerside, the fine capacitors arrays being inside;

a NT_N layer being arranged in a annular region distributed by the two transformers T1 and T2; the cross-coupled unit being located inside of the annular region and being out of touch with the NT_N layer; all capacitors arrays being located outside of the annular region.

2. The oscillator according to claim 1, wherein each capacitors array of $C_{G1}$, $C_{G2}$, $C_{D1}$ and $C_{D2}$ comprises a plurality of switched capacitors which are in parallel, and each switched capacitor is a adjustable capacitor.

3. The oscillator according to claim 2, wherein the two coarse capacitors arrays $C_{G1}$ and $C_{G2}$ have the same specifications and parameters; the two fine capacitors arrays $C_{D1}$ and $C_{D2}$ have the same specifications and parameters; the capacitances of the adjustable capacitors are changed synchronously for getting right frequency of the output of the oscillator.

4. The oscillator according to claim 3, wherein capacitors in the coarse capacitors array are gate capacitances, and capacitors in the fine capacitors array are source capacitances; the ratio of capacitance value between the gate capacitance and the source capacitance is 2~4.

5. The oscillator according to claim 3, wherein a capacitor defined as a decoupling capacitor is electrically connected between the ground Vss and the voltage source Vdd.

6. An integrated circuit, comprises a transformer-based distributed multicore oscillator according to claim 1;

wherein in the layout of the integrated circuit, the oscillator is further designed as follows:

(1) in the cross-coupled unit, the four MOS transistors M1~M4 being located at the four corners of a rectangular area one by one; any two adjacent MOS transistors being symmetric;

(2) the two transformers T1 and T2 being symmetrical; the two inner coils $L_d$ being cross-linked;

(3) the fine capacitors array $C_{D1}$ and the coarse capacitors array $C_{G1}$ being close to the first cross-coupled transistors pair, the fine capacitors array $C_{D2}$ and the coarse capacitors array $C_{G2}$ being close to the second cross-coupled transistors pair;

(4) two voltage sources Vdd and two grounds Vss being arranged outside of the cross-coupled unit, a first group defined by one voltage source Vdd and one ground Vss being close to the two MOS transistors M1 and M3, a second group defined by another voltage source Vdd and another ground Vss being close to the two MOS transistors M2 and M4; the two groups having a shortest physical distance.

7. The integrated circuit according to claim 6, wherein a full-differential capacitors array is defined by the two coarse capacitors arrays and the two fine capacitors arrays; the tail inductance $L_{tail1}$ is electrically connected between the ground Vss and the two source regions of the two MOS transistors M1 and M3, the tail inductance $L_{tail2}$ is electrically connected between the ground Vss and the two source regions of the two MOS transistors M2 and M4; the two tail inductances $L_{tail1}$ and $L_{tail2}$ run form the annular region without of touch with the NT_N layer to be below of the voltage source Vdd; a decoupling capacitor is connected between the voltage source Vdd and the ground Vss.

8. The integrated circuit according to claim 6, wherein each capacitors array of $C_{G1}$, $C_{G2}$, $C_{D1}$ and $C_{D2}$ comprises a plurality of switched capacitors which are in parallel, and each switched capacitor is a adjustable capacitor.

9. The integrated circuit according to claim 8, wherein the two coarse capacitors arrays $C_{G1}$ and $C_{G2}$ have the same specifications and parameters; the two fine capacitors arrays $C_{D1}$ and $C_{D2}$ have the same specifications and parameters; the capacitances of the adjustable capacitors are changed synchronously for getting right frequency of the output of the oscillator.

10. The integrated circuit according to claim 9, wherein capacitors in the coarse capacitors array are gate capacitances, and capacitors in the fine capacitors array are source capacitances; the ratio of capacitance value between the gate capacitance and the source capacitance is 2~4.

11. The integrated circuit according to claim 9, wherein a capacitor defined as a decoupling capacitor is electrically connected between the ground Vss and the voltage source Vdd.

12. A terminal, comprises:
an RF frequency device;
a integrated circuit according to claim 6, used to provide a local carrier signal for the RF device.

13. The terminal according to claim 12, wherein a full-differential capacitors array is defined by the two coarse capacitors arrays and the two fine capacitors arrays; the tail inductance $L_{tail1}$ is electrically connected between the ground Vss and the two source regions of the two MOS transistors M1 and M3, the tail inductance $L_{tail2}$ is electrically connected between the ground Vss and the two source regions of the two MOS transistors M2 and M4; the two tail inductances $L_{tail1}$ and $L_{tail2}$ run form the annular region without of touch with the NT_N layer to be below of the voltage source Vdd; a decoupling capacitor is connected between the voltage source Vdd and the ground Vss.

14. The terminal according to claim 12, wherein each capacitors array of $C_{G1}$, $C_{G2}$, $C_{D1}$ and $C_{D2}$ comprises a plurality of switched capacitors which are in parallel, and each switched capacitor is a adjustable capacitor.

15. The terminal according to claim 14, wherein the two coarse capacitors arrays $C_{G1}$ and $C_{G2}$ have the same specifications and parameters; the two fine capacitors arrays $C_{D1}$ and $C_{D2}$ have the same specifications and parameters; the capacitances of the adjustable capacitors are changed synchronously for getting right frequency of the output of the oscillator.

16. The terminal according to claim 15, wherein capacitors in the coarse capacitors array are gate capacitances, and capacitors in the fine capacitors array are source capacitances; the ratio of capacitance value between the gate capacitance and the source capacitance is 2~4.

17. The terminal according to claim 15, wherein a capacitor defined as a decoupling capacitor is electrically connected between the ground Vss and the voltage source Vdd.

* * * * *